(12) United States Patent
Huang

(10) Patent No.: US 11,335,290 B2
(45) Date of Patent: May 17, 2022

(54) DRIVE CIRCUIT, DRIVE DEVICE AND DISPLAY DEVICE

(71) Applicant: HKC CORPORATION LIMITED, Shenzhen (CN)

(72) Inventor: Xiaoyu Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 18 days.

(21) Appl. No.: 17/257,861

(22) PCT Filed: Jan. 8, 2019

(86) PCT No.: PCT/CN2019/070824
§ 371 (c)(1),
(2) Date: Jan. 5, 2021

(87) PCT Pub. No.: WO2020/124703
PCT Pub. Date: Jun. 25, 2020

(65) Prior Publication Data
US 2021/0295792 A1    Sep. 23, 2021

(30) Foreign Application Priority Data

Dec. 18, 2018 (CN) .......................... 201811547518.1
Dec. 18, 2018 (CN) .......................... 201822124079.5

(51) Int. Cl.
*G09G 3/20* (2006.01)
*G09G 3/36* (2006.01)
(Continued)

(52) U.S. Cl.
CPC ............. *G09G 3/3648* (2013.01); *H03K 5/24* (2013.01); *H03K 17/6871* (2013.01); *G09G 2300/0809* (2013.01); *G09G 2330/021* (2013.01)

(58) Field of Classification Search
CPC ............... G09G 3/2092; G09G 3/3648; G09G 2330/021; G09G 2300/0809; G09G 2330/028
See application file for complete search history.

(56) References Cited

U.S. PATENT DOCUMENTS

2017/0084218 A1* 3/2017 Choi .................... G09G 3/3696
2018/0336822 A1* 11/2018 Yan ...................... G09G 3/3233
2020/0251056 A1* 8/2020 Huang ................. G09G 3/2096

FOREIGN PATENT DOCUMENTS

CN          105304050 A      2/2016
CN          105405403 A      3/2016
(Continued)

*Primary Examiner* — Dennis P Joseph
(74) *Attorney, Agent, or Firm* — Bayramoglu Law Offices LLC

(57) ABSTRACT

A drive circuit, a drive device and a display device are provided. The drive circuit is connected to a drive voltage source, a threshold value voltage source, a turn-on voltage signal source, and a turn-off voltage signal source. The drive circuit includes a first comparison circuit, a second comparison circuit, a third comparison circuit, a first switch circuit, a second switch circuit, a third switch circuit and a fourth switch circuit. The drive circuit can turn off an output of a voltage source signal in a timely manner when an abnormality occurs in a panel, thereby preventing a gate-chip on film from working abnormally.

20 Claims, 2 Drawing Sheets

(51) Int. Cl.
*H03K 5/24* (2006.01)
*H03K 17/687* (2006.01)

(56) References Cited

FOREIGN PATENT DOCUMENTS

| | | |
|---|---|---|
| CN | 105513549 A | 4/2016 |
| CN | 105761696 A | 7/2016 |
| CN | 207765146 U | 8/2018 |
| CN | 109087613 A | 12/2018 |
| WO | 2013183531 A1 | 12/2013 |

* cited by examiner

DRIVE CIRCUIT, DRIVE DEVICE AND DISPLAY DEVICE

CROSS REFERENCE TO THE RELATED APPLICATIONS

This application is the national phase entry of International Application No. PCT/CN2019/070824, filed on Jan. 8, 2019, which is based upon and claims priority to Chinese Patent Applications No. 201811547518.1 and No. 201822124079.5, both filed on Dec. 18, 2018, the entire contents of which are incorporated herein by reference.

TECHNICAL FIELD

The present application relates to the field of display technology, and more particularly to a drive circuit, a drive circuit and a display device.

BACKGROUND

In a Thin Film Transistor Liquid Crystal Display (TFT-LCD), a system mainboard transmits a R/G/B compression signal, a control signal and a power signal, through wires, to connectors on Printed Circuit Board (PCB), and then video data after being processed by a timing controller (TCON) chip on the printed circuit board, via the printed circuit board, is transmitted to a display area of a panel by a Source-Chip on Film (S-COF) and a Gate-Chip on Film (G-COF), so that the liquid crystal display obtains the required power signal.

However, during a production process or during use, abnormal signals may be caused by foreign matter entering into the panel, which may lead to abnormal operations of the Gate-Chip on Film.

SUMMARY

An object of the present application is to provide a drive circuit, including but not limited to the purpose of eliminating the abnormal signals caused by foreign matter entering into the panel during production and use, resulting in abnormal operations of the Gate-Chip on Film.

An object of the present application is to provide a drive circuit connected with a drive voltage source, a threshold voltage source, a turn-on voltage signal source, and a turn-off voltage signal source, including:

a first comparison circuit connected with the drive voltage source and the threshold voltage source, which is configured to receive a drive voltage signal, compare the drive voltage signal with the threshold voltage, and output a corresponding first control signal;

a first switch circuit connected with the turn-on voltage signal source and the first comparison circuit, which is configured to receive a turn-on voltage signal and the first control signal, and control ON or OFF of the turn-on voltage signal according to the first control signal;

a second switch circuit connected with the turn-off voltage signal source and the first comparison circuit, which is configured to receive a turn-off voltage signal and the first control signal, and control ON or OFF of the turn-off voltage signal according to the first control signal;

a third switch circuit connected with the drive voltage source and the first comparison circuit, the third switch circuit includes a first output end and a second output end, the third switch circuit is configured to receive the drive voltage signal and the first control signal, and select the first output end or the second output end to output the drive voltage signal according to the first control signal;

a second comparison circuit connected with the first switch circuit and the first output end of the third switch circuit, which is configured to compare a voltage signal output from the first switch circuit with the drive voltage signal output from the first output end of the third switch circuit, and output a corresponding second control signal;

a third comparison circuit connected with the second switch circuit and the second output end of the third switch circuit, which is configured to compare a voltage signal output from the second switch circuit with the drive voltage signal output from the second output end of the third switch circuit, and output a corresponding third control signal; and a fourth switch circuit connected with a power supply voltage source, the second comparison circuit and the third comparison circuit, which is configured to receive a voltage source signal, the second control signal and the third control signal, and control ON or OFF of the voltage source signal according to the second control signal and the third control signal.

Optionally, the power supply voltage source is a power management chip.

Optionally, the drive voltage source is a Gate-Chip on Film.

Optionally, the signal output from the turn-on voltage signal source is a high-level signal.

Optionally, the signal output from the turn-off voltage signal source is a low-level signal.

Optionally, the first comparison circuit includes a first comparator, a first input end of the first comparator serves as a first input end of the first comparison circuit and is connected with the drive voltage source. a second input end of the first comparator serves as a second input end of the first comparison circuit and is connected with the threshold voltage source, and an output end of the first comparator serves as an output end of the first comparison circuit.

Optionally, the first comparator is a voltage comparator, a positive input end of the voltage comparator is the first input end of the first comparator, and a negative input end of the voltage comparator is the second input end of the voltage comparator, and an output end of the voltage comparator is the output end of the first comparator.

Optionally, the first switch circuit includes a first electronic switch tube, a current input end of the first electronic switch tube serves as an input end of the first switch circuit and is connected with the turn-on voltage signal source, a current output end of the first electronic switch tube serves as an output end of the first switch circuit and is connected with a first input end of the second comparison circuit, and a control end of the first electronic switch tube serves as a control end of the first switch circuit and is connected with an output end of the first comparison circuit.

Optionally, the first electronic switch tube is an N-type MOS tube, a drain electrode of the N-type MOS tube serves as the current input end of the first electronic switch tube, a source electrode of the N-type MOS tube serves as the current output end of the first electronic switch tube, and a gate electrode of the N-type MOS tube serves as the control end of the first electronic switch tube.

Optionally, the second switch circuit includes a second electronic switch tube, a current input end of the second electronic switch tube serves as an input end of the second switch circuit and is connected with the turn-off voltage signal source, a current output end of the second electronic switch tubes serves as an output end of the second switch circuit and is connected with a first input end of the third comparison circuit, and a control end of the second electronic switch tube serves as a control end of the second switch circuit is connected with an output end of the first comparison circuit.

Optionally, the second electronic switch tube is a P-type MOS tube, a source electrode of the P-type MOS tube serves as the current input end of the second electronic switch tube, a drain electrode of the P-type MOS tube serves as the current output end of the second electronic switch tube, and a gate electrode of the P-type MOS tube serves as the control end of the second electronic switch tube.

Optionally, the third switch circuit includes:

a fifth electronic switch tube, a current output end of the fifth electronic switch tube serves as the first output end of the third switch circuit and is connected with a second input end of the second comparison circuit; and a sixth electronic switch tube, a current input end of the sixth electronic switch tube and a current input end of the fifth electronic switch tube are connected as a drive voltage signal input end of the third switch circuit to be connected with the drive voltage source, a control end of the sixth electronic switch tube and a control end of the fifth electronic switch tube are connected as a control signal input end of the third switch circuit to be connected with an output end of the first comparison circuit, and a current output end of the sixth electronic switch tube serves as the second output end of the third switch circuit and is connected with a second input end of the third comparison circuit.

Optionally, the second comparison circuit includes a second comparator, a first input end of the second comparator serves as a first input end of the second comparison circuit and is connected with an output end of the first switch circuit, a second input end of the second comparator serves as a second input end of the second comparison circuit and is connected with the first output end of the third switch circuit, and an output end of the second comparator serves as an output end of the second comparison circuit and is connected with a first control signal input end of the fourth switch circuit.

Optionally, the third comparison circuit includes a third comparator, a first input end of the third comparator serves as a first input end of the third comparison circuit and is connected with an output end of the second switch circuit, a second input end of the third comparator serves as a second input end of the third comparison circuit and is connected with the second output end of the third switch circuit, and an output end of the third comparator serves as an output end of the third comparison circuit and is connected with a second control signal input end of the fourth switch circuit.

Optionally, the fourth switch circuit includes:

a third electronic switch tube, a current input end of the third electronic switch tube serves as an input end of the fourth switch circuit and is connected with the power supply voltage source, and a control end of the third electronic switch tube serves as the first control signal input end of the fourth switch circuit and is connected with the output end of the second comparison circuit;

a fourth electronic switch tube, a current input end of the fourth electronic switch tube is connected with a current output end of the third electronic switch tube, a control end of the fourth electronic switch tube serves as the second control signal input end of the fourth switch circuit and is connected with the output end of the third comparison circuit, and a current output end of the fourth electronic switch tube serves as the output end of the fourth switch circuit.

Another object of the present application is to provide a drive device, which includes:

a drive voltage source;

a threshold voltage source;

a turn-on voltage signal source;

a turn-off voltage signal source; and a drive circuit, the drive circuit is respectively connected with the drive voltage source, the threshold voltage source, the turn-on voltage signal source and the turn-off voltage signal source;

the drive circuit includes:

a first comparison circuit connected with the drive voltage source and the threshold voltage source, which is configured to receive a drive voltage signal, compare the drive voltage signal with the threshold voltage, and output a corresponding first control signal;

a first switch circuit connected with the turn-on voltage signal source and the first comparison circuit, which is configured to receive a turn-on voltage signal and the first control signal, and control ON or OFF of the turn-on voltage signal according to the first control signal;

a second switch circuit connected with the turn-off voltage signal source and the first comparison circuit, which is configured to receive a turn-off voltage signal and the first control signal, and control ON or OFF of the turn-off voltage signal according to the first control signal;

a third switch circuit connected with the drive voltage source and the first comparison circuit, the third switch circuit includes a first output end and a second output end, the third switch circuit is configured to receive the drive voltage signal and the first control signal, and select the first output end or the second output end to output the drive voltage signal according to the first control signal;

a second comparison circuit connected with the first switch circuit and the first output end of the third switch circuit, which is configured to compare a voltage signal output from the first switch circuit with the drive voltage signal output from the first output end of the third switch circuit, and output a corresponding second control signal;

a third comparison circuit connected with the second switch circuit and the second output end of the third switch circuit, which is configured to compare a voltage signal output from the second switch circuit with the drive voltage signal output from the second output end of the third switch circuit, and output a corresponding third control signal; and a fourth switch circuit connected with a power supply voltage source, the second comparison circuit and the third comparison circuit, which is configured to receive a voltage source signal, the second control signal and the third control signal, and control ON or OFF of the voltage source signal according to the second control signal and the third control signal.

Optionally, the first comparison circuit includes a first comparator, a first input end of the first comparator serves as a first input end of the first comparison circuit and is connected with the drive voltage source, a second input end of the first comparator serves as a second input end of the first comparison circuit and is connected with the threshold voltage source, and an output end of the first comparator serves as an output end of the first comparison circuit.

Optionally, the first comparator is a voltage comparator, a positive input end of the voltage comparator is the first input end of the first comparator, a negative input end of the voltage comparator is the second input end of the first comparator, and an output end of the voltage comparator is the output end of the first comparator.

Another object of the present application is to provide a display device, including:

a display panel; and a control circuit, the control circuit includes a drive circuit;

the drive circuit connected with a drive voltage source, a threshold voltage source, a turn-on voltage signal source and a turn-off voltage signal source, respectively;

the drive circuit includes:

a first comparison circuit connected with the drive voltage source and the threshold voltage source, which is configured to receive a drive voltage signal, compare the drive voltage signal with the threshold voltage, and output a corresponding first control signal;

a first switch circuit connected with the turn-on voltage signal source and the first comparison circuit, which is configured to receive a turn-on voltage signal and the first control signal, and control ON or OFF of the turn-on voltage signal according to the first control signal;

a second switch circuit connected with the turn-off voltage signal source and the first comparison circuit, which is configured to receive a turn-off voltage signal and the first control signal, and control ON or OFF of the turn-off voltage signal according to the first control signal;

a third switch circuit connected with the drive voltage source and the first comparison circuit, the third switch circuit includes a first output end and a second output end, the third switch circuit is configured to receive the drive voltage signal and the first control signal, and select the first output end or the second output end to output the drive voltage signal according to the first control signal;

a second comparison circuit connected with the first switch circuit and the first output end of the third switch circuit, which is configured to compare a voltage signal output from the first switch circuit with the drive voltage signal output from the first output end of the third switch circuit, and output a corresponding second control signal;

a third comparison circuit connected with the second switch circuit and the second output end of the third switch circuit, which is configured to compare a voltage signal output from the second switch circuit with the drive voltage signal output from the second output end of the third switch circuit, and output a corresponding third control signal; and a fourth switch circuit connected with a power supply voltage source, the second comparison circuit and the third comparison circuit, which is configured to receive a voltage source signal, the second control signal and the third control signal, and control ON or OFF of the voltage source signal according to the second control signal and the third control signal.

Optionally, the first switch circuit includes a first electronic switch tube, a current input end of the first electronic switch tube serves as a input end of the first switch circuit and is connected with the turn-on voltage signal source, a current output end of the first electronic switch tube serves as an output end of the first switch circuit and is connected with a first input end of the second comparison circuit, and a control end of the first electronic switch tube serves as a control end of the first switch circuit and is connected with an output end of the first comparison circuit.

The embodiments of the present application provide a drive circuit, a drive device, and a display device. By comparing the drive voltage signal with the threshold voltage through a comparison circuit, and a corresponding first control signal is output, the first switch circuit is configured to control ON or OFF of the turn-on voltage signal according to the first control signal, the second switch circuit is configured to control ON or OFF of the turn-off voltage signal according to the first control signal, the third switch circuit is configured to select the first output end or the second output end to output the drive voltage signal according to the first control signal, and the fourth switch circuit is configured to control ON or OFF of the voltage source signal according to the second control signal output from the second comparison circuit and the third control signal output from the third comparison circuit, such that the output of the voltage source signal can be cut off in time when the signal in the panel is abnormal, thereby achieving the purpose of eliminating the abnormal signals caused by the foreign matter entering into the panel during the production and use process, which causes the Gate-Chip on Film to work abnormally.

BRIEF DESCRIPTION OF THE DRAWINGS

In order to explain the technical solution of embodiments of the present application more clearly, a brief introduction regarding the accompanying drawings that need to be used for describing the embodiments or exemplary technology is given below; It is obvious that the drawings in the following description are merely some embodiments of the present application, and for ordinarily skilled one in the art, other drawings can also be obtained according to the current drawings on the premise of paying no creative labor.

DETAILED DESCRIPTION OF THE EMBODIMENTS

Figure 1:
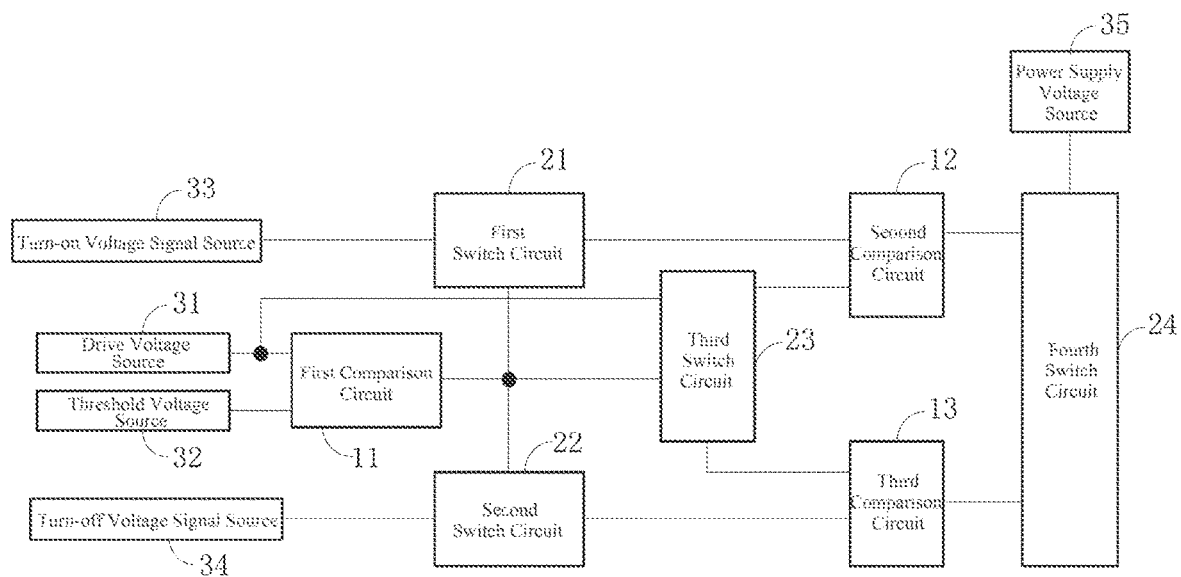
FIG. 1 is a schematic structural diagram of a drive circuit in accordance with an embodiment of the application.

In order to make the objectives, technical solutions and advantages of the present application more comprehensible, the following further describes the present application in detail with reference to the accompanying drawings and embodiments. It should be understood that the specific embodiments described herein are merely used to explain the present application, and are not intended to limit the present application.

It should be noted that when a component is referred to as being "fixed to" or "arranged/provided on" another component, it can be directly or indirectly on the other component. When a component is referred to as being "connected with/with" another component, it can be directly or indirectly connected with the other component. The terms "upper", "lower", "left", "right", etc. indicate the orientation or positional relationship based on the orientation or positional relationship shown in the drawings, which are merely for ease of description, and are not indicated or implied the device or the element referred to must have a specific orientation, be constructed and operated in a specific orientation, and therefore cannot be understood as limitations of the present application. For those of ordinary skill in the art, specific meanings of the above terms can be understood according to specific conditions. The terms "first" and "second" are merely used for ease of description, and cannot be understood as indicating or implying relative importance or implicitly indicating the number of technical features. The meaning of "a plurality" means two or more than two, unless otherwise specifically defined.

In order to illustrate the technical solutions described in the present application, the following further describes in detail with reference to specific drawings and embodiments.

FIG. 1 is a schematic structural diagram of a drive circuit in accordance with an embodiment of the application.

As shown in FIG. 1, the drive circuit in this embodiment is connected with a drive voltage source 31, a threshold voltage source 32, a turn-on voltage signal source 33 and a turn-off voltage signal source 34, which includes:

a first comparison circuit 11 connected with the drive voltage source 31 and the threshold voltage source 32, which is configured to receive a drive voltage signal, compare the drive voltage signal with a threshold voltage, and output a corresponding first control signal;

a first switch circuit 21 connected with the turn-on voltage signal source 33 and the first comparison circuit 11, which is configured to receive a turn-on voltage signal and the first control signal, and control ON or OFF of the turn-on voltage signal according to the first control signal;

a second switch circuit 22 connected with the turn-off voltage signal source 34 and the first comparison circuit 11, which is configured to receive a turn-off voltage signal and the first control signal, and control ON or OFF of the turn-off voltage signal according to the first control signal;

a third switch circuit 23 connected with the drive voltage source 31 and the first comparison circuit 11, the third switch circuit 23 includes a first output end and a second output end, the third switch circuit 23 is configured to receive a drive voltage signal and the first control signal, and select the first output end or the second output end to output the drive voltage signal according to the first control signal;

a second comparison circuit 12 connected with the first switch circuit 21 and the first output end of the third switch circuit 23, which is configured to compare a voltage signal output from the first switch circuit 21 with the drive voltage signal output from the first output end of the third switch circuit 23, and output a corresponding second control signal;

a third comparison circuit 13 connected with the second switch circuit 22 and the second output end of the third switch circuit 23, which is configured to compare a voltage signal output from the second switch circuit 22 with the drive voltage signal output from the second output end of the third switch circuit 23, and output a corresponding third control signal; and a fourth switch circuit 24 connected with a power supply voltage source 35, the second comparison circuit 12 and the third comparison circuit 13, which is configured to receive a voltage source signal, the second control signal and the third control signal, and control ON or OFF of the voltage source signal according to the second control signal and the third control signal.

In one embodiment, the power management chip serves as the power supply voltage source 35, and a voltage of a power signal output from the power supply voltage source 35 is VDD.

In one embodiment, the signal output from the last scanning line in the Gate-Chip on Film (G-COF) serves as the drive voltage source 31, and a voltage of a driving signal output from the drive voltage source 31 is V1.

In one embodiment, the signal output from the turn-on voltage signal source 33 is a high-level signal, and the turn-on voltage signal output from the turn-on voltage signal source 33 is VGH.

In one embodiment, the signal output from the turn-off voltage signal source 34 is a low-level signal, and the turn-off voltage signal output from the turn-off voltage signal source 34 is VGL.

In one embodiment, the voltage VGH of the turn-on voltage signal serves as a gate switching-on voltage on the printed circuit board, and the voltage VGL of the turn-off voltage signal is used as a gate switching-off voltage on the printed circuit board.

In one embodiment, when the Gate-Chip on Film works normally, the voltage of the output high voltage signal is VGH, and the voltage of the output low voltage signal is VGL.

In an embodiment, the threshold voltage source 32 may be a reference voltage set by a user. Specifically, a threshold voltage of the threshold voltage source 32 may be specifically set according to actual needs of the user. In this embodiment, the threshold voltage of the threshold voltage source 32 may be expressed by GND.

In an embodiment, the first control signal output from the first comparison circuit 11 is at a low level when the voltage signals at a first input end and a second input end of the first comparison circuit 11 are the same, the first control signal output from the first comparison circuit 11 is at a high level when the voltage signal at the first input end of the first comparison circuit 11 is greater than the voltage signal at the second input end, and the first control signal output from the first comparison circuit 11 is at a high level when the voltage signal at the first input end of the first comparison circuit 11 is less than the voltage signal at the second input end.

In an embodiment, the second control signal output from the second comparison circuit 12 is at a low level when the voltage signals at a first input end and a second input end of the second comparison circuit 12 are the same, the second control signal output from the second comparison circuit 12 is at a high level when the voltage signal at the first input end of the second comparison circuit 12 is greater than the voltage signal at the second input end, and the second control signal output from the second comparison circuit 12 is at a high level when the voltage signal at the first input end of the second comparison circuit 12 is less than the voltage signal at the second input end.

In an embodiment, the third control signal output from the third comparison circuit 13 is at a low level when the voltage signals at a first input end and a second input end of the third comparison circuit 13 are the same, the third control signal output from the third comparison circuit 13 is at a high level when the voltage signal at the first input end of the third comparison circuit 13 is greater than the voltage signal at the second input end, and the third control signal output from the third comparison circuit 13 is at a high level when the voltage signal at the first input end of the third comparison circuit 13 is less than the voltage signal at the second input end.

In one embodiment, when the system is working, when the drive voltage signal V1 output from the drive voltage source 31 is at a high level, at this time, the voltage of the drive voltage signal is greater than the threshold voltage GND, and the first comparison circuit 11 outputs at a high level, meanwhile, the first switch circuit 21 is switched on, the first output end of the third switch circuit 23 is set as a signal output end, the first output end of the third switch circuit 23 outputs the drive voltage signal V1, and the second output end of the third switch circuit 23 is switched off, such that the second input end of the third comparison circuit 13 is suspended, and since the second switch circuit 22 is also in an off state, the first input end of the third comparison circuit 13 is also suspended, at this time, the third control signal output from the third comparison circuit 13 is at a low level. When the drive voltage signal V1 output from the drive voltage source 31 is in normal, V1=VGH, and the voltage of the turn-on voltage signal input from the first input end of the second comparison circuit 12 is equal to the drive voltage signal input from the second input end, at this time, the second control signal output from the second comparison circuit 12 is at a low level. On this occasion, the fourth switch circuit 24 controls the voltage source signal to be turned on according to the second control signal and the third control signal, and the system works normally.

In one embodiment, when the system works abnormally, the drive voltage signal V1 output from the drive voltage source 31 is less than the turn-on voltage signal VGH, at this time, the second control signal output from the second comparison circuit 12 is at a high level, and the fourth switch circuit 24 controls the voltage source signal to turn off the voltage source signal according to the second control signal and the third control signal. On this occasion, the power supply voltage source 35 stops outputting the voltage source signal, thereby preventing the back-end circuit from malfunctioning due to abnormal input signals.

In one embodiment, when the system is working, when the drive voltage signal V1 output from the drive voltage source 31 is at a low level, at this time, the voltage V1 of the drive voltage signal V1 is less than the threshold voltage GND, and the first comparison circuit 11 outputs at a low level, the first switch circuit 21 is switched off, the second output end of the third switch circuit 23 serves as a signal output end, and the second switch circuit 22 is switched on. When the drive voltage signal V1 output from the drive voltage source 31 is in normal, V1=GND, the voltage of the turn-off voltage signal input from the second input end of the second comparison circuit 12 is equal to the drive voltage signal input from the second input end, at this time, the second control signal output from the second comparison circuit 12 is at a low level. On this occasion, the switch circuit 24 controls the voltage source signal to be turned on according to the second control signal and the third control signal, and the system works normally.

In one embodiment, when the system works abnormally, the drive voltage signal V1 output from the drive voltage source 31 is less than the turn-off voltage signal VGH, at this time, the second control signal output from the second comparison circuit 12 is at a high level, and the fourth switch circuit 24 controls the voltage source signal to turn off the voltage source signal according to the second control signal and the third control signal. On this occasion, the power supply voltage source 35 stops outputting the voltage source signal, thereby preventing the back-end circuit from malfunctioning due to abnormal input signals.

In one embodiment, the power supply voltage source 35 is configured to supply power to the drive voltage source 31.

In one embodiment, the drive voltage source 31 is a Gate-Chip on Film, comparing the voltage output from the Gate-Chip on Film with a preset standard voltage. The preset standard voltage may be a voltage output from the threshold voltage source 32, Generally, when a short circuit to ground occurs in the panel, or when the impedance is too small, the output voltage of the Gate-Chip on Film will be abnormal. Therefore, when the standard voltage is not met, the fourth switch circuit 24 is controlled to turn off the power input of the Gate-Chip on Film to avoid burning due to foreign matter entering into the panel.

In one embodiment, the drive voltage signal output from the Gate-Chip on Film is set to turn on the thin film transistor in the display panel. The drive voltage signal may be set to turn on the high level of the thin film transistor or turn off the low level of the thin film transistor to realize the turn-on or turn-off of the thin film transistor, the voltage range of high and low levels to achieve the turn-on or turn-off of the thin film transistor is larger, and the fluctuation of the output voltage of the Gate-Chip on Film also indicates that there are abnormalities inside the panel, therefore, by detecting the voltage output from the Gate-Chip on Film, and controlling the fourth switch circuit 24 to turn off the power input of the Gate-Chip on Film when the voltage output from the Gate-Chip on Film does not meet the standard voltage, abnormalities due to short circuit or low resistance occurred in the display panel is avoided.

Figure 2:
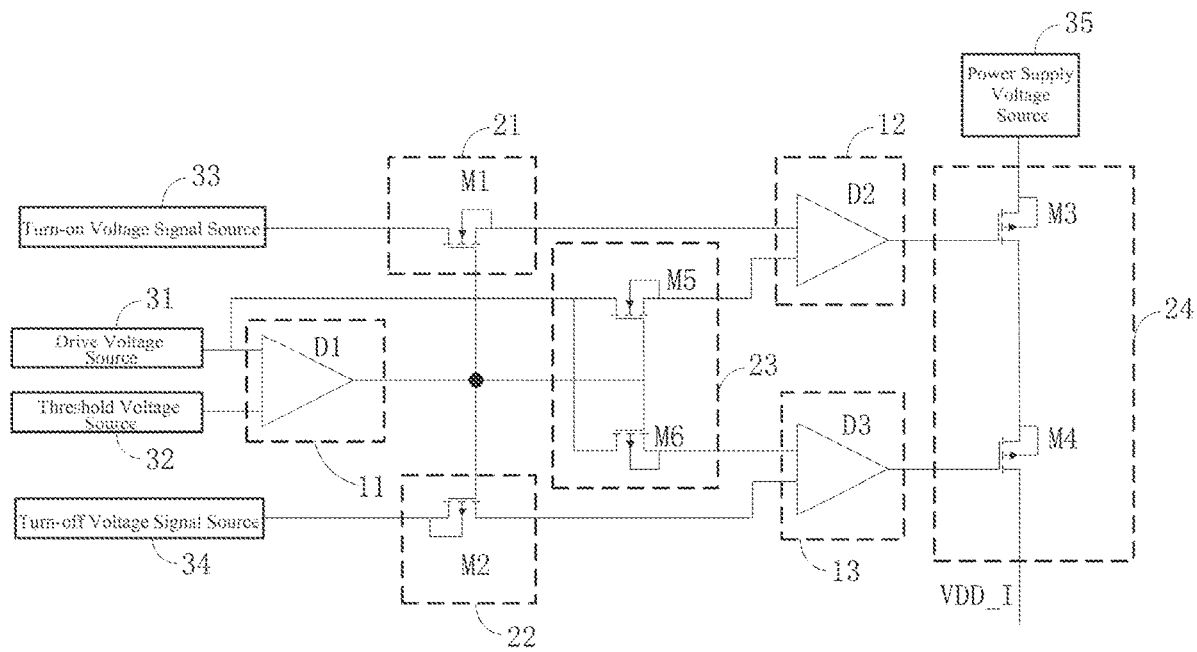
FIG. 2 is a schematic structural diagram of a drive circuit in accordance with another embodiment of the application.

FIG. 2 is a schematic structural diagram of a drive circuit in accordance with another embodiment of the application.

Referring to FIG. 2, in one embodiment, the first comparison circuit 11 includes a first comparator D1, a first input end of the first comparator D1 serves as the first input end of the first comparison circuit 11 and is connected with the drive voltage source 31, a second input end of the first comparator D1 serves as the second input end of the first comparison circuit 11 and is connected with the threshold voltage source 32, and an output end of the first comparator D1 serves as the output end of the first comparison circuit 11.

In one embodiment, the first comparator D1 is a voltage comparator, a positive input end of the voltage comparator is the first input end of the first comparator D1, and a negative input end of the voltage comparator is the second input end of the first comparator D1, and an output end of the voltage comparator is the output end of the first comparator D1.

Referring to FIG. 2, in an embodiment, the first switch circuit 21 includes a first electronic switch tube M1, a current input end of the first electronic switch tube M1 serves as the input end of the first switch circuit 21 and is connected with the turn-on voltage signal source 33, a current output end of the first electronic switch tube M1 serves as the output end of the first switch circuit 21 is connected with the first input end of the second comparison circuit 12, and a control end of the first electronic switch tube M1 serves as the control end of the first switch circuit 21 and is connected with the output end of the first comparison circuit 11.

In one embodiment, the first electronic switch tube M1 is an N-type MOS tube, a drain electrode of the N-type MOS tube serves as the current input end of the first electronic switch tube M1, a source electrode of the N-type MOS tube serves as the current output end of the first electronic switch tube M1, and a gate electrode of the N-type MOS tube serves as the control end of the first electronic switch tube M1.

Referring to FIG. 2, in one embodiment, the second switch circuit 22 includes a second electronic switch tube M2, a current input end of the second electronic switch tube M2 serves as the input end of the second switch circuit 22 and is connected with the turn-off voltage signal source 34, a current output end of the second electronic switch tube M2 serves as the output end of the second switch circuit 22 and is connected with the first input end of the third comparison circuit 13, and a control end of the second electronic switch tube M2 serves as the control end of the second switch circuit 22 and is connected with the output end of the first comparison circuit 11.

In one embodiment, the second electronic switch tube M2 is a P-type MOS tube, and a source electrode of the P-type MOS tube serves as the current input end of the second electronic switch tube M2, a drain electrode of the P-type MOS tube serves as the current output end of the second electronic switch tube M2, and a gate electrode of the P-type MOS tube serves as the control end of the second electronic switch tube M2.

Referring to FIG. 2, in one embodiment, the third switch circuit 23 includes:

a fifth electronic switch tube M5, a current output end of the fifth electronic switch tube M5 serves as the first output end of the third switch circuit 23 and is connected with the second input end of the second comparison circuit 12; and a sixth electronic switch tube M6, a current input end of the sixth electronic switch tube M6 and the current input end of the fifth electronic switch tube M5 are connected as a drive voltage signal input end of the third switching circuit 23 to be connected with the drive voltage source 31, and a control end of the sixth electronic switch tube M6 and a control end of the fifth electronic switch tube M5 are connected as a control signal input end of the third switch circuit 23 to be connected with the output end of the first comparison circuit 11, and a current output end of the sixth electronic switch tube M6 serves as the second output end of the third switch circuit 23 and is connected with the second input end of the third comparison circuit 13.

In one embodiment, the fifth electronic switch tube M5 is an N-type MOS tube, a drain electrode of the N-type MOS tube serves as the current input end of the fifth electronic switch tube M5, a gate electrode of the N-type MOS tube serves as the control end of the fifth electronic switch tube M5 and a source electrode of the N-type MOS tube serve as the current output end of the fifth electronic switch tube M5.

In one embodiment, the sixth electronic switch tube M6 is a P-type MOS tube, a drain electrode of the P-type MOS tube serves as the current output end of the sixth electronic switch tube M6, a gate electrode of the P-type MOS tube serves as the control end of the sixth electronic switch tube M6 and a source electrode of the P-type MOS tube serve as the current input end of the sixth electronic switch tube M6.

Referring to FIG. 2, in one embodiment, the second comparison circuit 12 includes a second comparator D2, a first input end of the second comparator D2 serves as the first input end of the second comparison circuit 12 and is connected with the output end of the first switch circuit 21, a second input end of the second comparator D2 serves as the second input end of the second comparison circuit 12 and is connected with the first output end of the third switch circuit 23, and an output end of the second comparator 12 serves as the output end of the second comparison circuit 12 and is connected with a first control signal input end of the fourth switch circuit 24.

In one embodiment, the second comparator 12 is a voltage comparator, a positive input end of the voltage comparator is the first input end of the second comparator 12, and a negative input end of the voltage comparator is the second input end of the second comparator 12, and an output end of the voltage comparator is the output end of the second comparator 12.

Referring to FIG. 2, in one embodiment, the third comparison circuit 13 includes a third comparator D3, and a first input end of the third comparator D3 serves as the first input end of the third comparison circuit 13 and is connected with the output end of the second switch circuit 23, a second input end of the third comparator D3 serves as the second input end of the third comparison circuit 13 and is connected with the second output end of the third switch circuit 23, and an output end of the third comparator D3 serves as the output end of the third comparison circuit 13 and is connected with a second control signal input end of the fourth switch circuit 24.

In one embodiment, the third comparator D3 is a voltage comparator, a positive input end of the voltage comparator is the first input end of the third comparator D3, a negative input end of the voltage comparator is the second input end of the third comparator D3, and an output end of the voltage comparator is the output end of the third comparator D3.

Referring to FIG. 2, in one embodiment, the fourth switch circuit 24 includes:

a third electronic switch tube M3, a current input end of the third electronic switch tube M3 serves as the input end of the fourth switch circuit 24 and is connected with the power supply voltage source 35, and a control end of the third electronic switch tube M3 serves as the control signal input end of the fourth switch circuit 24 and is connected with the output end of the second comparison circuit 12;

a fourth electronic switch tube M4, a current input end of the fourth electronic switch tube M4 is connected with a current output end of the third electronic switch tube M3, a control end of the fourth electronic switch tube M4 serves as a second control signal input end of the fourth switch circuit 24 and is connected with the output end of the third comparison circuit 13, and a current output end of the fourth electronic switch tube M4 serves as the output end of the fourth switch circuit 24.

In one embodiment, the third electronic switch tube M3 and the fourth electronic switch tube M4 are P-type MOS tubes, the drain electrode of the P-type MOS tube serves as the current output ends of the third electronic switch tube M3 and the fourth electronic switch tube M4, the gate electrode of the P-type MOS tube serves as the control ends of the third electronic switch tube M3 and the fourth electronic switch tube M4, and the source electrode of the P-type MOS tube serves as the current input ends of the third electronic switch tube M3 and the fourth electronic switch tube M4.

An embodiment of the present application further provides a drive device, which includes:

a drive voltage source 31;
a threshold voltage source 32;
a turn-on voltage signal source 33;
a turn-off voltage signal source 34; and
a drive circuit connected with the drive voltage source 31, the threshold voltage source 32, the turn-on voltage signal source 33 and the turn-off voltage signal source 34, respectively;

the drive circuit including:

a first comparison circuit 11 connected with the drive voltage source 31 and the threshold voltage source 32, which is configured to receive the drive voltage signal, compare the drive voltage signal with the threshold voltage, and output a corresponding first control signal;

a first switch circuit 21 connected with the turn-on voltage signal source 33 and the first comparison circuit 11, which is configured to receive a turn-on voltage signal and the first control signal, and control ON or OFF of the turn-on voltage signal according to the first control signal;

a second switch circuit 22 connected with the turn-off voltage signal source 34 and the first comparison circuit 11, which is configured to receive a turn-off voltage signal and the first control signal, and control ON or OFF of the turn-off voltage signal according to the first control signal;

a third switch circuit 23 connected with the drive voltage source 31 and the first comparison circuit 11, the third switch circuit 23 includes a first output end and a second output end, the third switch circuit 23 is configured to receive a drive voltage signal and the first control signal, and select the first output end or the second output end to output the drive voltage signal according to the first control signal;

a second comparison circuit 12 connected with the first switch circuit 21 and the first output end of the third switch circuit 23, which is configured to compare a voltage signal output from the first switch circuit 21 with the drive voltage signal output from the first output end of the third switch circuit 23, and output a corresponding second control signal;

a third comparison circuit 13 connected with the second switch circuit 22 and the second output end of the third switch circuit 23, which is configured to compare a voltage signal output from the second switch circuit 22 with the drive voltage signal output from the second output end of the third switch circuit 23, and output a corresponding third control signal; and a fourth switch circuit 24 connected with a power supply voltage source 35, the second comparison circuit 12 and the third comparison circuit 13, which is configured to receive a voltage source signal, the second control signal and the third control signal, and control ON or OFF of the voltage source signal according to the second control signal and the third control signal.

In one embodiment, a power management chip serves as the power supply voltage source 35, and the voltage of the power signal output from the power supply voltage source 35 is VDD.

In one embodiment, a signal output from the last scanning line in the Gate-Chip on Film (G-COF) serves as the drive voltage source 31, and the voltage of the driving signal output from the drive voltage source 31 is V1.

In one embodiment, a signal output from the turn-on voltage signal source 33 is a high-level signal, and the turn-on voltage signal output from the turn-on voltage signal source 33 is VGH.

In one embodiment, a signal output from the turn-off voltage signal source 34 is a low-level signal, and the turn-off voltage signal output from the turn-off voltage signal source 34 is VGL.

In one embodiment, the voltage VGH of the turn-on voltage signal serves as a gate switching-on voltage on the printed circuit board, and the voltage VGL of the turn-off voltage signal serves as a gate switching-off voltage on the printed circuit board.

In one embodiment, when the Gate-Chip on Film works normally, the voltage of the output high voltage signal is VGH, and the voltage of the output low voltage signal is VGL.

In one embodiment, the power supply voltage source 35 is configured to supply power to the drive voltage source 31.

Referring to FIG. 2, in one embodiment, the first comparison circuit 11 includes a first comparator D1, the first input end of the first comparator D1 serves as the first input end of the first comparison circuit 11 and is connected with the drive voltage source 31, the second input end of the first comparator D1 serves as the second input end of the first comparison circuit 11 and is connected with the threshold voltage source 32, and the output end of the first comparator D1 serves as the output end of the first comparison circuit 11.

In one embodiment, the first comparator D1 is a voltage comparator, the positive input end of the voltage comparator is the first input end of the first comparator D1, the negative input end of the voltage comparator is the second input end of the first comparator D1, and the output end of the voltage comparator is the output end of the first comparator D1.

Referring to FIG. 2, in an embodiment, the first switch circuit 21 includes a first electronic switch tube M1, and the current input end of the first electronic switch tube M1 serves as the input end of the first switch circuit 21 and is connected with the turn-on voltage signal source 33, the current output end of the first electronic switch tube M1 serves as the output end of the first switch circuit 21 and is connected with the first input end of the second comparison circuit 12, and the control end of the first electronic switch tube M1 serves as the control end of the first switch circuit 21 and is connected with the output end of the first comparison circuit 11.

In one embodiment, the first electronic switch tube M1 is an N-type MOS tube, and the drain electrode of the N-type MOS tube serves as the current input end of the first electronic switch tube M1, the source electrode of the N-type MOS tube serves as the current output end of the first electronic switch tube M1, and the gate electrode of the N-type MOS tube serves as the control end of the first electronic switch tube M1.

Referring to FIG. 2, in one embodiment, the second switch circuit 22 includes a second electronic switch tube M2, the current input end of the second electronic switch tube M2 serves as the input end of the second switch circuit 22 and is connected with the turn-off voltage signal source 34, the current output end of the second electronic switch tube M2 serves as the output end of the second switch circuit 22 and is connected with the first input end of the third comparison circuit 13, and the control end of the second electronic switch tube M2 serves as the control end of the second switch circuit 22 and is connected with the output end of the first comparison circuit 11.

In one embodiment, the second electronic switch tube M2 is a P-type MOS tube, and the source electrode of the P-type MOS tube serves as the current input end of the second electronic switch tube M2, the drain electrode of the P-type MOS tube serves as the current output end of the second electronic switch tube M2, and the gate electrode of the P-type MOS tube serves as the control end of the second electronic switch tube M2.

Referring to FIG. 2, in one embodiment, the third switch circuit 23 includes:

a fifth electronic switch tube M5, a current output end of the fifth electronic switch tube M5 serves as the first output end of the third switch circuit 23 and is connected with a second input end of the second comparison circuit 12; and a sixth electronic switch tube M6, a current input end of the sixth electronic switch tube M6 and a current input end of the fifth electronic switch tube M5 are connected as a drive voltage signal input end of the third switching circuit 23 to be connected with the drive voltage source 31, a control end of the sixth electronic switch tube M6 and a control end of the fifth electronic switch tube M5 are connected as a control signal input end of the third switch circuit 23 to be connected with an output end of the first comparison circuit 11, and a current output end of the sixth electronic switch tube M6 serves as the second output end of the third switch circuit 23 and is connected with a second input end of the third comparison circuit 13.

In one embodiment, the fifth electronic switch tube M5 is an N-type MOS tube, the drain electrode of the N-type MOS tube serves as the current input end of the fifth electronic switch tube M5, the gate electrode of the N-type MOS tube serves as the control end of the fifth electronic switch tube M5 and the source electrode of the N-type MOS tube serves as the current output end of the fifth electronic switch tube M5.

In one embodiment, the sixth electronic switch tube M6 is a P-type MOS tube, the drain electrode of the P-type MOS tube serves as the current output end of the sixth electronic switch tube M6, and the gate electrode of the P-type MOS tube serves as the control end of the sixth electronic switch tube M6 and the source electrode of the P-type MOS tube serves as the current input end of the sixth electronic switch tube M6.

Referring to FIG. 2, in one embodiment, the second comparison circuit 12 includes a second comparator D2, the first input end of the second comparator D2 serves as the first input end of the second comparison circuit 12 and is connected with the output end of the first switch circuit 21, the second input end of the second comparator D2 serves as the second input end of the second comparison circuit 12 and is connected with the first output end of the third switch circuit 23, and the output end of the second comparator 12 serves as the output end of the second comparison circuit 12 and is connected with the first control signal input end of the fourth switch circuit 24.

In one embodiment, the second comparator 12 is a voltage comparator, the positive input end of the voltage comparator is the first input end of the second comparator 12, the negative input end of the voltage comparator is the second input end of the second comparator 12, and the output end of the voltage comparator is the output end of the second comparator 12.

Referring to FIG. 2, in one embodiment, the third comparison circuit 13 includes a third comparator D3, the first input end of the third comparator D3 serves as the first input end of the third comparison circuit 13 and is connected with the output end of the second switch circuit 23, the second input end of the third comparator D3 serves as the second input end of the third comparison circuit 13 and is connected with the second output end of the third switch circuit 23, and the output end of the third comparator D3 serves as the output end of the third comparison circuit 13 and is connected with the second control signal input end of the fourth switch circuit 24.

In one embodiment, the third comparator D3 is a voltage comparator, the positive input end of the voltage comparator is the first input end of the third comparator D3, the negative input end of the voltage comparator is the second input end of the third comparator D3, and the output end of the voltage comparator is the output end of the third comparator D3.

Referring to FIG. 2, in one embodiment, the fourth switch circuit 24 includes: a third electronic switch tube M3, a current input end of the third electronic switch tube M3 serves as an input end of the fourth switch circuit 24 and is connect with the power supply voltage source 35, and a control end of the third electronic switch tube M3 serves as a first control signal input end of the fourth switch circuit 24 and is connected with an output end of the second comparison circuit 12;

a fourth electronic switch tube M4, a current input end of the fourth electronic switch tube M4 is connected with a current output end of the third electronic switch tube M3, a control end of the fourth electronic switch tube M4 serves as a second control signal input end of the fourth switch circuit 24 and is connected with an output end of the third comparison circuit 13, and a current output end of the fourth electronic switch tube M4 serves as an output end of the fourth switch circuit 24.

Figure 3:
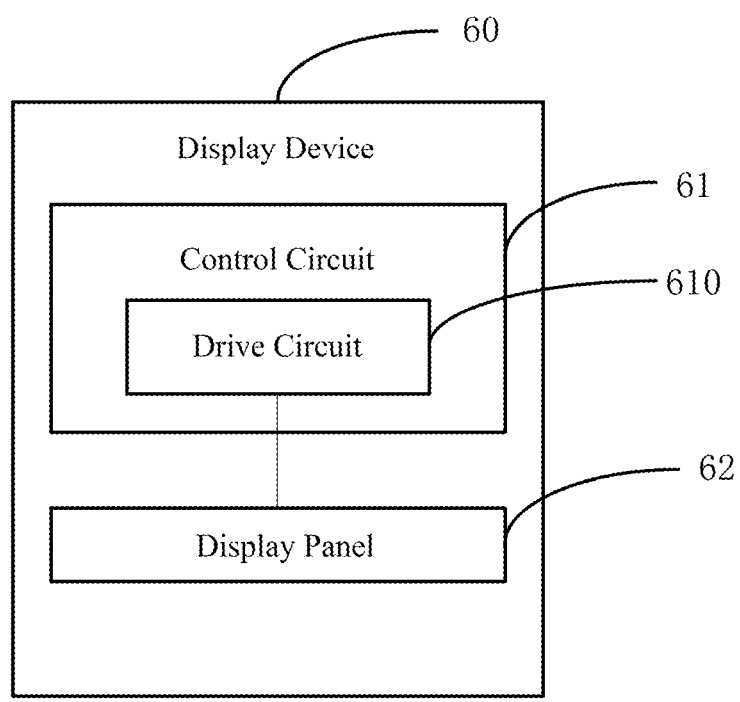
FIG. 3 is a schematic structural diagram of a display device in accordance with an embodiment of the application.

FIG. 3 is a schematic structural diagram of a display device in accordance with an embodiment of the application.

As shown in FIG. 3, the display device 60 in this embodiment includes:

a display panel 62; and a control circuit 61, where the control circuit 61 includes a drive circuit 610;

the drive circuit 610 connected with a drive voltage source 31, a threshold voltage source 32, a turn-on voltage signal source 33 and a turn-off voltage signal source 34, respectively;

the drive circuit 610 including:

a first comparison circuit 11 connected with the drive voltage 31 and the threshold voltage source 32, which is configured to receive a drive voltage signal, compare the drive voltage signal with a threshold voltage, and output a corresponding first control signal;

a first switch circuit 21 connected with the turn-on voltage signal source 33 and the first comparison circuit 11, which is configured to receive a turn-on voltage signal and the first control signal, and control ON or OFF of the turn-on voltage signal according to the first control signal;

a second switch circuit 22 connected with the turn-off voltage signal source 34 and the first comparison circuit 11, which is configured to receive a turn-off voltage signal and the first control signal, and control ON or OFF of the turn-off voltage signal according to the first control signal;

a third switch circuit 23 connected with the drive voltage source 31 and the first comparison circuit 11. The third switch circuit 23 includes a first output end and a second output end. The third switch circuit 23 is configured to receive a drive voltage signal and the first control signal, and select the first output end or the second output end to output the drive voltage signal according to the first control signal;

a second comparison circuit 12 connected with the first switch circuit 21 and the first output end of the third switch circuit 23, which is configured to compare a voltage signal output from the first switch circuit 21 with the drive voltage signal output from the first output end of the third switch circuit 23, and output a corresponding second control signal;

a third comparison circuit 13 connected with the second switch circuit 22 and the second output end of the third switch circuit 23, which is configured to compare a voltage signal output from the second switch circuit 22 and the drive voltage signal output from the second output end of the third switch circuit 23, and output a corresponding third control signal; and a fourth switch circuit 24 connected with a power supply voltage source 35, the second comparison circuit 12 and the third comparison circuit 13, which is configured to receive a voltage source signal, the second control signal, and the third control signal, and control ON or OFF of the voltage source signal according to the second control signal and the third control signal.

Referring to FIG. 2, in an embodiment, the first switch circuit 21 includes a first electronic switch tube M1, the current input end of the first electronic switch tube M1 serves as the input end of the first switch circuit 21 and is connected with the turn-on voltage signal source 33, the current output end of the first electronic switch tube M1 serves as the output end of the first switch circuit 21 and is connected with the first input end of the second comparison circuit 12, and the control end of the first electronic switch tube M1 serves as the control end of the first switch circuit 21 and is connected with the output end of the first comparison circuit 11.

In one embodiment, the first electronic switch tube M1 is an N-type MOS tube, and the drain electrode of the N-type MOS tube serves as the current input end of the first electronic switch tube M1, the source electrode of the N-type MOS tube serves as the current output end of the first electronic switch tube M1, and the gate electrode of the N-type MOS tube serves as the control end of the first electronic switch tube M1.

In an embodiment, the display device 60 may be any type of display device provided with the above-mentioned drive circuit 610, such as a Liquid Crystal Display (LCD), an organic Electroluminesence Display (OLED), Quantum Dot Light Emitting Diodes (QLED) or a curved display device, etc.

In one embodiment, the display panel 62 includes a pixel array composed of multiple rows of pixels and multiple columns of pixels.

In an embodiment, the control circuit 61 may be implemented by a general integrated circuit, such as a Central Processing Unit (CPU), or an Application Specific Integrated Circuit (ASIC).

The embodiments of the present application provide a drive circuit, a drive device and a display device. By comparing the drive voltage signal with the threshold voltage through a comparison circuit, a corresponding first control signal is output. The first switch circuit controls ON or OFF of the turn-on voltage signal according to the first control signal, the second switch circuit controls ON or OFF of the turn-off voltage signal according to the first control signal, the third switch circuit selects the first output end or the second output end to output the drive voltage signal according to the first control signal, and the fourth switch circuit controls ON or OFF of the voltage source signal according to the second control signal output from the second comparison circuit and the third control signal output from the third comparison circuit, such that the output of the voltage source signal can be cut off in time when the signal in the panel is abnormal, thereby archiving the purpose of eliminating the abnormal signal caused by the foreign matter entering into the panel during the production process and during use, which causes the Gate-Chip on Film to work abnormally.

The above disclosures are merely optional embodiments of the present application, and are not intended to limit the present application. Any modification, equivalent replacement and improvement made within the spirit and principle of the present application shall be included by the protection scope of the present application.

What is claimed is:

1. A drive circuit connected to a drive voltage source, a threshold voltage source, a turn-on voltage signal source, and a turn-off voltage signal source, comprising:
   a first comparison circuit, wherein the first comparison circuit is connected to the drive voltage source and the threshold voltage source, and the first comparison circuit is configured to receive a drive voltage signal, compare the drive voltage signal with a threshold voltage, and output a first control signal; wherein the first control signal corresponds to the drive voltage signal and the threshold voltage;
   a first switch circuit, wherein the first switch circuit is connected to the turn-on voltage signal source and the first comparison circuit, and the first switch circuit is configured to receive a turn-on voltage signal and the first control signal, and control on or off of the turn-on voltage signal according to the first control signal;
   a second switch circuit, wherein the second switch circuit is connected to the turn-off voltage signal source and the first comparison circuit, and the second switch circuit is configured to receive a turn-off voltage signal and the first control signal, and control on or off of the turn-off voltage signal according to the first control signal;
   a third switch circuit, wherein the third switch circuit is connected to the drive voltage source and the first comparison circuit; the third switch circuit comprises a first output end and a second output end; the third switch circuit is configured to receive the drive voltage signal and the first control signal, and select the first output end or the second output end to output the drive voltage signal according to the first control signal;
   a second comparison circuit, wherein the second comparison circuit is connected to the first switch circuit and the first output end of the third switch circuit, and the second comparison circuit is configured to compare a first voltage signal output from the first switch circuit with the drive voltage signal output from the first output end of the third switch circuit, and output a second control signal; wherein the second control signal corresponds to the first voltage signal output from the first switch circuit and the drive voltage signal output from the first output end of the third switch circuit;
   a third comparison circuit, wherein the third comparison circuit is connected to the second switch circuit and the second output end of the third switch circuit, and the third comparison circuit is configured to compare a second voltage signal output from the second switch circuit with the drive voltage signal output from the second output end of the third switch circuit, and output a third control signal; wherein the third control signal corresponds to the second voltage signal output from the second switch circuit and the drive voltage signal output from the second output end of the third switch circuit; and
   a fourth switch circuit, wherein the fourth switch circuit is connected to a power supply voltage source, the second comparison circuit and the third comparison circuit, and the fourth switch circuit is configured to receive a voltage source signal, the second control signal and the third control signal, and control on or off of the voltage source signal according to the second control signal and the third control signal.

2. The drive circuit of claim 1, wherein the power supply voltage source is a power management chip.

3. The drive circuit of claim 1, wherein the drive voltage source is a Gate-Chip on Film.

4. The drive circuit of claim 1, wherein the turn-on voltage signal output from the turn-on voltage signal source is a high-level signal.

5. The drive circuit of claim 1, wherein the turn-off voltage signal output from the turn-off voltage signal source is a low-level signal.

6. The drive circuit of claim 1, wherein the first comparison circuit comprises a first comparator; wherein a first input end of the first comparator serves as a first input end of the first comparison circuit, and the first input end of the first comparator is connected to the drive voltage source; a second input end of the first comparator serves as a second input end of the first comparison circuit, and the second input end of the first comparator is connected to the threshold voltage source; and an output end of the first comparator serves as an output end of the first comparison circuit.

7. The drive circuit of claim 6, wherein the first comparator is a voltage comparator, wherein a positive input end of the voltage comparator is the first input end of the first comparator, a negative input end of the voltage comparator is the second input end of the first comparator, and an output end of the voltage comparator is the output end of the first comparator.

8. The drive circuit of claim 1, wherein the first switch circuit comprises a first electronic switch tube; wherein a current input end of the first electronic switch tube serves as an input end of the first switch circuit, and the current input end of the first electronic switch tube is connected to the turn-on voltage signal source; a current output end of the first electronic switch tube serves as an output end of the first switch circuit, and the current output end of the first electronic switch tube is connected to a first input end of the second comparison circuit; a control end of the first electronic switch tube serves as a control end of the first switch circuit, and the control end of the first electronic switch tube is connected to an output end of the first comparison circuit.

9. The drive circuit of claim 8, wherein the first electronic switch tube is an N-type MOS tube, wherein a drain electrode of the N-type MOS tube serves as the current input end of the first electronic switch tube, a source electrode of the N-type MOS tube serves as the current output end of the first electronic switch tube, and a gate electrode of the N-type MOS tube serves as the control end of the first electronic switch tube.

10. The drive circuit of claim 1, wherein the second switch circuit comprises a second electronic switch tube; wherein a current input end of the second electronic switch tube serves as an input end of the second switch circuit, and the current input end of the second electronic switch tube is connected to the turn-off voltage signal source; a current output end of the second electronic switch tube serves as an output end of the second switch circuit, and the current output end of the second electronic switch tube is connected to a first input end of the third comparison circuit; a control end of the second electronic switch tube serves as a control end of the second switch circuit, and the control end of the second electronic switch tube is connected to an output end of the first comparison circuit.

11. The drive circuit of claim 10, wherein the second electronic switch tube is a P-type MOS tube; wherein a source electrode of the P-type MOS tube serves as the current input end of the second electronic switch tube, a drain electrode of the P-type MOS tube serves as the current output end of the second electronic switch tube, and a gate electrode of the P-type MOS tube serves as the control end of the second electronic switch tube.

12. The drive circuit of claim 1, wherein the third switch circuit comprises:
    a fifth electronic switch tube, wherein a current output end of the fifth electronic switch tube serves as the first output end of the third switch circuit, and the current output end of the fifth electronic switch tube is connected to a second input end of the second comparison circuit; and
    a sixth electronic switch tube, wherein a current input end of the sixth electronic switch tube and a current input end of the fifth electronic switch tube are connected and serve as a drive voltage signal input end of the third switch circuit, and the drive voltage signal input end of the third switch circuit is connected to the drive voltage source; a control end of the sixth electronic switch tube and a control end of the fifth electronic switch tube are connected and serve as a control signal input end of the third switch circuit, and the control signal input end of the third switch circuit is connected to an output end of the first comparison circuit; a current output end of the sixth electronic switch tube serves as the second output end of the third switch circuit, and the current output end of the sixth electronic switch tube is connected to a second input end of the third comparison circuit.

13. The drive circuit of claim 1, wherein the second comparison circuit comprises a second comparator; wherein a first input end of the second comparator serves as a first input end of the second comparison circuit, and the first input end of the second comparator is connected to an output end of the first switch circuit; a second input end of the second comparator serves as a second input end of the second comparison circuit, and the second input end of the second comparator is connected to the first output end of the third switch circuit; an output end of the second comparator serves as an output end of the second comparison circuit, and the output end of the second comparator is connected to a first control signal input end of the fourth switch circuit.

14. The drive circuit of claim 1, wherein the third comparison circuit comprises a third comparator; wherein a first input end of the third comparator serves as a first input end of the third comparison circuit, and the first input end of the third comparator is connected to an output end of the second switch circuit; a second input end of the third comparator serves as a second input end of the third comparison circuit, and the second input end of the third comparator is connected to the second output end of the third switch circuit; an output end of the third comparator serves as an output end of the third comparison circuit, and the output end of the third comparator is connected to a second control signal input end of the fourth switch circuit.

15. The drive circuit of claim 1, wherein the fourth switch circuit comprises:
    a third electronic switch tube, wherein a current input end of the third electronic switch tube serves as an input end of the fourth switch circuit, and the current input end of the third electronic switch tube is connected to the power supply voltage source; and a control end of the third electronic switch tube serves as a first control signal input end of the fourth switch circuit, and the control end of the third electronic switch tube is connected to an output end of the second comparison circuit; and
    a fourth electronic switch tube, wherein a current input end of the fourth electronic switch tube is connected to a current output end of the third electronic switch tube; a control end of the fourth electronic switch tube serves as a second control signal input end of the fourth switch circuit, and the control end of the fourth electronic switch tube is connected to an output end of the third comparison circuit; and a current output end of the fourth electronic switch tube serves as an output end of the fourth switch circuit.

16. A drive device, comprising:
    a drive voltage source;
    a threshold voltage source;
    a turn-on voltage signal source;
    a turn-off voltage signal source; and
    a drive circuit wherein the drive circuit is connected to the drive voltage source, the threshold voltage source, the turn-on voltage signal source and the turn-off voltage signal source, respectively;
    the drive circuit comprises:
    a first comparison circuit, wherein the first comparison circuit is connected to the drive voltage source and the threshold voltage source, and the first comparison circuit is configured to receive a drive voltage signal, compare the drive voltage signal with a threshold voltage, and output a first control signal; wherein the first control signal corresponds to the drive voltage signal and the threshold voltage;
    a first switch circuit, wherein the first switch circuit is connected to the turn-on voltage signal source and the first comparison circuit, and the first switch circuit is configured to receive a turn-on voltage signal and the first control signal, and control on or off of the turn-on voltage signal according to the first control signal;

a second switch circuit, wherein the second switch circuit is connected to the turn-off voltage signal source and the first comparison circuit, and the second switch circuit is configured to receive a turn-off voltage signal and the first control signal, and control on or off of the turn-off voltage signal according to the first control signal;

a third switch circuit, wherein the third switch circuit is connected to the drive voltage source and the first comparison circuit; the third switch circuit comprises a first output end and a second output end; the third switch circuit is configured to receive the drive voltage signal and the first control signal, and select the first output end or the second output end to output the drive voltage signal according to the first control signal;

a second comparison circuit, wherein the second comparison circuit is connected to the first switch circuit and the first output end of the third switch circuit, and the second comparison circuit is configured to compare a first voltage signal output from the first switch circuit with the drive voltage signal output from the first output end of the third switch circuit, and output a second control signal; wherein the second control signal corresponds to the first voltage signal output from the first switch circuit and the drive voltage signal output from the first output end of the third switch circuit;

a third comparison circuit, wherein the third comparison circuit is connected to the second switch circuit and the second output end of the third switch circuit, and the third comparison circuit is configured to compare a second voltage signal output from the second switch circuit with the drive voltage signal output from the second output end of the third switch circuit, and output a third control signal; wherein the third control signal corresponds to the second voltage signal output from the second switch circuit and the drive voltage signal output from the second output end of the third switch circuit; and a fourth switch circuit, wherein the fourth switch circuit is connected to a power supply voltage source, the second comparison circuit and the third comparison circuit, and the fourth switch circuit is configured to receive a voltage source signal, the second control signal and the third control signal, and control on or off of the voltage source signal according to the second control signal and the third control signal.

17. The drive device of claim 16, wherein the first comparison circuit comprises a first comparator; wherein a first input end of the first comparator serves as a first input end of the first comparison circuit, and the first input end of the first comparator is connected to the drive voltage source; a second input end of the first comparator serves as a second input end of the first comparison circuit, and the second input end of the first comparator is connected to the threshold voltage source; and an output end of the first comparator serves as an output end of the first comparison circuit.

18. The drive device of claim 17, wherein the first comparator is a voltage comparator, wherein a positive input end of the voltage comparator is the first input end of the first comparator, a negative input end of the voltage comparator is the second input end of the first comparator, and an output end of the voltage comparator is the output end of the first comparator.

19. A display device, comprising:

a display panel; and a control circuit, wherein the control circuit comprises a drive circuit;

the drive circuit is connected to a drive voltage source, a threshold voltage source, a turn-on voltage signal source and a turn-off voltage signal source, respectively;

the drive circuit comprises:

a first comparison circuit, wherein the first comparison circuit is connected to the drive voltage source and the threshold voltage source, and the first comparison circuit is configured to receive a drive voltage signal, compare the drive voltage signal with a threshold voltage, and output a first control signal; wherein the first control signal corresponds to the drive voltage signal and the threshold voltage;

a first switch circuit, wherein the first switch circuit is connected to the turn-on voltage signal source and the first comparison circuit, and the first switch circuit is configured to receive a turn-on voltage signal and the first control signal, and control on or off of the turn-on voltage signal according to the first control signal;

a second switch circuit, wherein the second switch circuit is connected to the turn-off voltage signal source and the first comparison circuit, and the second switch circuit is configured to receive a turn-off voltage signal and the first control signal, and control on or off of the turn-off voltage signal according to the first control signal;

a third switch circuit, wherein the third switch circuit is connected to the drive voltage source and the first comparison circuit; the third switch circuit comprises a first output end and a second output end; the third switch circuit is configured to receive the drive voltage signal and the first control signal, and select the first output end or the second output end to output the drive voltage signal according to the first control signal;

a second comparison circuit, wherein the second comparison circuit is connected to the first switch circuit and the first output end of the third switch circuit, and the second comparison circuit is configured to compare a first voltage signal output from the first switch circuit with the drive voltage signal output from the first output end of the third switch circuit, and output a second control signal; wherein the second control signal corresponds to the first voltage signal output from the first switch circuit and the drive voltage signal output from the first output end of the third switch circuit;

a third comparison circuit, wherein the third comparison circuit is connected to the second switch circuit and the second output end of the third switch circuit, and the third comparison circuit is configured to compare a second voltage signal output from the second switch circuit with the drive voltage signal output from the second output end of the third switch circuit, and output a third control signal; wherein the third control signal corresponds to the second voltage signal output from the second switch circuit and the drive voltage signal output from the second output end of the third switch circuit; and a fourth switch circuit, wherein the fourth switch circuit is connected to a power supply voltage source, the second comparison circuit and the third comparison circuit, and the fourth switch circuit is configured to receive a voltage source signal, the second control signal and the third control signal, and control on or off of the voltage source signal according to the second control signal and the third control signal.

20. The display device of claim 19, wherein the first switch circuit comprises a first electronic switch tube; wherein a current input end of the first electronic switch tube serves as an input end of the first switch circuit, and the current input end of the first electronic switch tube is connected to the turn-on voltage signal source; a current output end of the first electronic switch tube serves as an output end of the first switch circuit, and the current output end of the first electronic switch tube is connected to a first input end of the second comparison circuit; a current output end of the first electronic switch tube serves as a control end of the first switch circuit, and the current output end of the first electronic switch tube is connected to an output end of the first comparison circuit.

* * * * *